(12) United States Patent
Hua et al.

(10) Patent No.: US 10,872,914 B2
(45) Date of Patent: Dec. 22, 2020

(54) DETECTION SUBSTRATE, RAY IMAGING DEVICE AND METHOD FOR DRIVING DETECTION SUBSTRATE

(71) Applicants: Beijing BOE Optoelectronics Technology Co., Ltd., Beijing (CN); BOE Technology Group Co., Ltd., Beijing (CN)

(72) Inventors: Gang Hua, Beijing (CN); Yanna Xue, Beijing (CN); Jian Wang, Beijing (CN); Yong Zhang, Beijing (CN); Zhiying Bao, Beijing (CN); Lei Mi, Beijing (CN); Lu Bai, Beijing (CN); Jingpeng Wang, Beijing (CN); Haobo Fang, Beijing (CN); Jian Lin, Beijing (CN); Limin Zhang, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/397,869

(22) Filed: Apr. 29, 2019

(65) Prior Publication Data
US 2020/0052017 A1 Feb. 13, 2020

(30) Foreign Application Priority Data
Aug. 9, 2018 (CN) .......................... 2018 1 0903596

(51) Int. Cl.
*H01L 27/146* (2006.01)
*G01T 1/20* (2006.01)
*H04N 5/359* (2011.01)

(52) U.S. Cl.
CPC ...... *H01L 27/14614* (2013.01); *G01T 1/2018* (2013.01); *H01L 27/14609* (2013.01); (Continued)

(58) Field of Classification Search
CPC ......... H01L 27/14614; H01L 27/14616; H01L 27/14623; H01L 27/14636; (Continued)

(56) References Cited

U.S. PATENT DOCUMENTS 9,293,506 B2 * 3/2016 Fujiyoshi .......... H01L 27/14692
2015/0316661 A1 * 11/2015 Fujiyoshi .............. G01T 1/2018
378/62

(Continued)

FOREIGN PATENT DOCUMENTS

CN 103257498 A 8/2013

*Primary Examiner* — Kiho Kim
(74) *Attorney, Agent, or Firm* — Westman, Champlin & Koehler, P.A.

(57) ABSTRACT

A detection substrate, a ray imaging device, and a method for driving a detection substrate are provided. The detection substrate includes a base substrate; a plurality of sensing TFTs; a plurality of signal read lines; a compensation TFT row including a plurality of compensation TFTs, wherein a first electrode of each of the compensation TFTs is electrically connected to the same signal read line as first electrodes of the sensing TFTs in corresponding sensing TFT column. As for the sensing TFTs and the compensation TFT electrically connected to the same signal read line, the first electrodes of both the sensing TFTs and the compensation TFT are source electrodes or drain electrodes, source-drain directions of the sensing TFTs are consistent with one another, and a source-drain direction of the compensation TFT is opposite to each of the source-drain directions of the sensing TFTs.

18 Claims, 8 Drawing Sheets

(52) U.S. Cl.
CPC .. *H01L 27/14616* (2013.01); *H01L 27/14623* (2013.01); *H01L 27/14636* (2013.01); *H01L 27/14663* (2013.01); *H04N 5/359* (2013.01)

(58) Field of Classification Search
CPC ......... H01L 27/14663; H01L 27/14603; H01L 27/14612; H01L 27/14609; G01T 1/2018; H04N 5/359
See application file for complete search history.

(56) References Cited

U.S. PATENT DOCUMENTS

| | | | |
|---|---|---|---|
| 2016/0126269 A1* | 5/2016 | Fujita | H01L 27/14663 250/208.1 |
| 2017/0094202 A1* | 3/2017 | Kobayashi | H01L 27/14612 |

* cited by examiner

DETECTION SUBSTRATE, RAY IMAGING DEVICE AND METHOD FOR DRIVING DETECTION SUBSTRATE

CROSS-REFERENCE TO RELATED APPLICATION

This application claims the benefit of Chinese Patent Application No. 201810903596.4 filed on Aug. 9, 2018 in the State Intellectual Property Office of China, the whole disclosure of which is incorporated herein by reference.

TECHNICAL FIELD

The present disclosure relates to the field of X-ray detection, and in particular to a detection substrate, a ray imaging device, and a method for driving a detection substrate.

BACKGROUND

An indirect Ray imaging device typically employs a thin film transistor (abbreviated as TFT) array to control electrical signal output of each pixel, and the output electrical signal is proportional to an intensity of X-ray received by a corresponding pixel. Such an electrical signal is affected by a parasitic capacitance between a gate electrode and a source electrode of the thin film transistor or a parasitic capacitance between a gate electrode and a drain electrode of the thin film transistor, and the parasitic capacitances may depend on an overlap portion between the gate electrode and the source electrode of the thin film transistor and an overlap portion between the gate electrode and the drain electrode of the thin film transistor, respectively.

SUMMARY

In an aspect, a detection substrate is provided including: a base substrate including a sensing region and an auxiliary region; a plurality of sensing thin film transistors arranged in a matrix in the sensing region to form a plurality of sensing thin film transistor rows and a plurality of sensing thin film transistor columns; a plurality of signal read lines and a plurality of gate lines in the sensing region, wherein the plurality of signal read lines cross the plurality of gate lines, respectively, first electrodes of the sensing thin film transistors in each of the sensing thin film transistor columns are electrically connected to the same signal read line, and gate electrodes of the sensing thin film transistors in each of the sensing thin film transistor rows are electrically connected to the same gate line; a compensation thin film transistor row in the auxiliary region, the compensation thin film transistor row including a plurality of compensation thin film transistors, wherein the plurality of compensation thin film transistors are in one-to-one correspondence with the plurality of sensing thin film transistor columns, and a first electrode of each of the compensation thin film transistors is electrically connected to the same signal read line as the first electrodes of the sensing thin film transistors in the corresponding sensing thin film transistor column; and a compensation gate line electrically connected to a gate electrode of each of the compensation thin film transistors; wherein, as for the sensing thin film transistors and the compensation thin film transistor electrically connected to the same signal read line, both the first electrodes of the sensing thin film transistors and the first electrode of the compensation thin film transistor are source electrodes or both the first electrodes of the sensing thin film transistors and the first electrode of the compensation thin film transistor are drain electrodes, source-drain directions of the sensing thin film transistors are consistent with one another, and a source-drain direction of the compensation thin film transistor is opposite to each of the source-drain directions of the sensing thin film transistors.

Optionally, the detection substrate further includes: a dummy thin film transistor column in the auxiliary region, the dummy thin film transistor column including a plurality of dummy thin film transistors, wherein the plurality of dummy thin film transistors are in one-to-one correspondence with the plurality of sensing thin film transistor rows or the compensation thin film transistor row, and a gate electrode of each of the dummy thin film transistors is electrically connected to the same gate line as the gate electrodes of the sensing thin film transistors in the corresponding sensing thin film transistor row or electrically connected to the same compensation gate line as the gate electrodes of the compensation thin film transistors in the corresponding compensation thin film transistor row; and a dummy signal read line, a first electrode of each of the dummy thin film transistors electrically connected to the dummy signal read line, wherein source-drain directions of the dummy thin film transistors corresponding to the sensing thin film transistor rows are consistent with one another, and a source-drain direction of the dummy thin film transistor corresponding to the compensation thin film transistor row is opposite to each of the source-drain directions of the dummy thin film transistors corresponding to the sensing thin film transistor rows.

Optionally, as for the sensing thin film transistors and the compensation thin film transistor electrically connected to the same signal read line, each of the sensing thin film transistors produces a first parasitic capacitance, and the compensation thin film transistor produces a second parasitic capacitance, and a sum of a value of the first parasitic capacitance and a value of the second parasitic capacitance is independent of a position shift of a source/drain layer pattern of each of the sensing thin film transistors and the compensation thin film transistor.

Optionally, as for the sensing thin film transistors and the compensation thin film transistor electrically connected to the same signal read line, the sensing thin film transistors are located at a first side of the signal read line, and the compensation thin film transistor is located at a second side, different from the first side, of the signal read line.

Optionally, the dummy thin film transistors corresponding to the sensing thin film transistor rows are located at a first side of the dummy signal read line, and the dummy thin film transistor corresponding to the compensation thin film transistor row is located at a second side, different from the first side, of the dummy signal read line.

Optionally, the source-drain direction of each of the sensing thin film transistors, the compensation thin film transistors and the dummy thin film transistors is perpendicular to an extending direction of the signal read line electrically connected to the each of the sensing thin film transistors, the compensation thin film transistors and the dummy thin film transistors.

Optionally, the detection substrate further includes a plurality of photoelectric converters on the base substrate, the plurality of photoelectric converters electrically connected to second electrodes of the sensing thin film transistors, respectively, wherein each of the photoelectric converters is configured to receive optical signal and convert the optical signal into electrical signal.

Optionally, the detection substrate further includes a plurality of photoelectric converters on the base substrate, the plurality of photoelectric converters electrically connected to second electrodes of the sensing thin film transistors and second electrodes of the dummy thin film transistors, respectively, wherein the photoelectric converters electrically connected to the second electrodes of the dummy thin film transistors are covered by a light shielding layer and located between the light shielding layer and the base substrate.

Optionally, the plurality of photoelectric converters further include photoelectric converters respectively electrically connected to second electrodes of the compensation thin film transistors, and the photoelectric converters electrically connected to the second electrodes of the compensation thin film transistors are covered by the light shielding layer and located between the light shielding layer and the base substrate.

Optionally, second electrodes of the compensation thin film transistors are floating.

Optionally, as for the sensing thin film transistors and the compensation thin film transistor electrically connected to the same signal read line, an orthographic projection of the gate electrode of each sensing thin film transistor on the base substrate partially overlaps an orthographic projection of the second electrode of the each sensing thin film transistor on the base substrate to form a first parasitic capacitance; and an orthographic projection of the gate electrode of the compensation thin film transistor on the base substrate partially overlaps an orthographic projection of the second electrode of the compensation thin film transistor on the base substrate to form a second parasitic capacitance, and wherein a value of the first parasitic capacitance is not equal to a value of the second parasitic capacitance.

Optionally, as for the sensing thin film transistors and the compensation thin film transistor electrically connected to the same signal read line, an orthographic projection of the gate electrode of each sensing thin film transistor on the base substrate partially overlaps an orthographic projection of the second electrode of the each sensing thin film transistor on the base substrate to form a first overlap region; and an orthographic projection of the gate electrode of the compensation thin film transistor on the base substrate partially overlaps an orthographic projection of the second electrode of the compensation thin film transistor on the base substrate to form a second overlap region, wherein an area of the first overlap region is not equal to an area of the second overlap region.

Optionally, the light shielding layer further covers the sensing thin film transistors, the compensation thin film transistors and the dummy thin film transistors.

Optionally, as for the sensing thin film transistors and the compensation thin film transistor electrically connected to the same signal read line, each of the sensing thin film transistors has the same specifications, except for the source-drain direction, as the compensation thin film transistor.

Optionally, the compensation gate line is configured to turn on the compensation thin film transistors while any one of the plurality of gate lines is scanned to turn on one of the plurality of sensing thin film transistor rows.

Optionally, a channel region of each of the sensing thin film transistors and a channel region of each of the compensation thin film transistors have the same shape selected from "-" shape, "U" shape or "L" shape.

In another aspect, a ray imaging device is provided including: the detection substrate as described above; and a ray generator at a side of the detection substrate.

In a further aspect, a method for driving the detection substrate as described above is provided, including: turning on a row of the sensing thin film transistors through the gate line; turning on the compensation thin film transistors in the compensation thin film transistor row through the compensation gate line while the row of the sensing thin film transistors are turned on; and adding electrical signal which is output to the signal read line from the sensing thin film transistor and electrical signal which is output to the same signal read line from the compensation thin film transistor together to output a compensation electrical signal.

Optionally, the method further includes: subtracting electrical signal output from the dummy signal read line from the compensation electrical signal output from any one of the signal read lines so as to revise the compensation electrical signal.

DETAILED DESCRIPTION OF EMBODIMENTS

Figure 1:
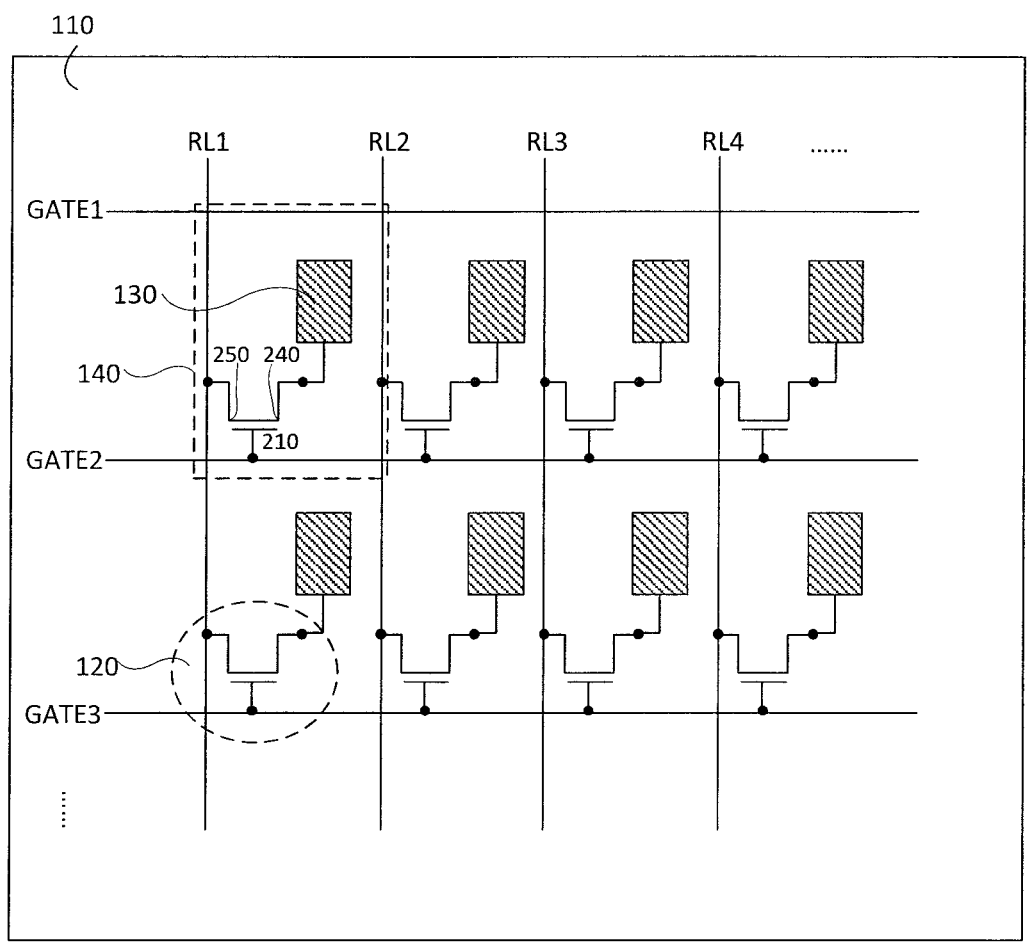
FIG. 1 shows an equivalent circuit diagram of a detection substrate.

Technical solutions in embodiments of the present disclosure will be clearly and completely described below in conjunction with accompanying drawings in the embodiments of the present disclosure in order to make objectives, technical solutions and advantages of the embodiments of the present disclosure more clear. It is apparent that the described embodiments are a part of the embodiments of the present disclosure, rather than all of the embodiments of the present disclosure. All other embodiments obtained by those skilled in the art based on the described embodiments of the present disclosure without departing from the scope of the present disclosure are within the scope of the present disclosure. It should be noted that the same elements are denoted by the same or similar reference numerals throughout the drawings. In the following description, some specific embodiments are for illustrative purposes only, and are not to be construed as limiting the present disclosure. Conventional structures or configurations will be omitted when they may cause confusion to understanding of the present disclosure. It should be noted that the shapes and sizes of various elements in the drawings do not reflect the true sizes and proportions, but merely illustrate contents of the embodiments of the present disclosure.

Technical or scientific terms used in the embodiments of the present disclosure should be of ordinary meaning as understood by those skilled in the art, unless otherwise defined. The terms "first", "second" and similar words used in the embodiments of the present disclosure do not denote any order, quantity, or importance, but are merely used to distinguish different components.

As used herein, an expression "source-drain direction" denotes a direction from a source electrode of a thin film transistor to a drain electrode of the thin film transistor, and specifically, a portion of an active layer of the thin film transistor that is parallel to a base substrate may extend from the source electrode to the drain electrode, thus such an extending direction of the portion of the active layer may be defined as the "source-drain direction".

In this context, a plurality of sensing thin film transistors are arranged on a base substrate in a matrix to form a plurality of rows of sensing thin film transistors and a plurality of columns of sensing thin film transistors, that is, to form a plurality of sensing thin film transistor rows and a plurality of sensing thin film transistor columns. In other words, a plurality of sensing thin film transistors in the same row may constitute one sensing thin film transistor row, and a plurality of sensing thin film transistors in the same column may constitute one sensing thin film transistor column.

Embodiments of the present disclosure will be specifically described below with reference to the accompanying drawings.

FIG. 1 shows an equivalent circuit diagram of a detection substrate 100. As shown in FIG. 1, the detection substrate 100 includes a base substrate 110, a plurality of sensing thin film transistors 120, a plurality of signal read lines RL, a plurality of gate lines GATE, and a plurality of photoelectric converters 130.

The base substrate 110 includes a sensing region, in which the plurality of sensing thin film transistors 120 are arranged. The plurality of sensing thin film transistors 120 are arranged in a matrix in the sensing region of the base substrate 110. Each of the sensing thin film transistors 120 may be N-type or P-type. The plurality of sensing thin film transistors 120 may be arranged in a matrix of, for example, m×n, where m and n are both positive integers greater than one. That is, there are m sensing thin film transistor rows and n sensing thin film transistor columns. Each of the sensing thin film transistors 120 may include a gate electrode 210, a first electrode (e.g., drain electrode) 250 and a second electrode (e.g., source electrode) 240.

The plurality of signal read lines RL are arranged in the sensing region of the base substrate 110. The first electrodes 250 of the sensing thin film transistors 120 in each sensing thin film transistor column are electrically connected to one of the plurality of signal read lines RL. For an array in an m×n form, the plurality of signal read lines RL may include signal read lines RL1-RLn. The signal read lines RL may be electrically connected to a signal reading circuit.

The first electrode of the sensing thin film transistor 120 may be one of a source electrode or a drain electrode. Similarly, the second electrode of the sensing thin film transistor 120 may be the other one of the source electrode or drain electrode. In general, the source electrode and the drain electrode of the thin film transistor are interchangeable. Hereinafter, for ease of description, the first electrode is designated as the drain electrode and the second electrode is designated as the source electrode. Thus, a parasitic capacitance to be considered hereinafter is a parasitic capacitance Cgs between the gate electrode and the source electrode of the sensing thin film transistor 120. Those skilled in the art may understand that the technical solutions of the present disclosure are equally applicable to a case in which the first electrode is the source electrode while the second electrode is the drain electrode. The sensing thin film transistors which are electrically connected to the same one signal read line have the same source-drain direction. In some embodiments, a source-drain direction of each thin film transistor (including dummy thin film transistor and compensation thin film transistor described below) is perpendicular to an extending direction of the signal read line to which the thin film transistor is electrically connected.

The plurality of gate lines GATE are arranged in the sensing region of the base substrate 110. The plurality of gate lines GATE cross the plurality of signal read lines RL in the sensing region. The gate electrodes 210 of the sensing thin film transistors 120 in the sensing thin film transistor row are electrically connected to one of the plurality of gate lines GATE. For an array in an m×n form, the plurality of gate lines GATE may include gate lines GATE1-GATEm. The plurality of gate lines GATE may be electrically connected to a gate driving circuit.

The plurality of photoelectric converters 130 are arranged in the sensing region of the base substrate 110. The plurality of photoelectric converters 130 may be in one-to-one correspondence with the plurality of sensing thin film transistors 120, and each photoelectric converter 130 may be electrically connected to the second electrode 240 of the corresponding sensing thin film transistor 120. The photoelectric converter 130 is configured to receive optical signal and convert the received optical signal into electrical signal such that the electrical signal may be transmitted to the signal reading circuit through the corresponding signal read line RL in a case where the sensing thin film transistor 120 to which the photoelectric converter 130 is electrically connected is turned on.

The photoelectric converter 130 may be a photoresistor, a phototransistor, a photodiode or a photocoupler or the like. In some exemplary embodiments, the photoelectric converter 130 is a photodiode. Specifically, the photodiode may have a PIN structure including an N-type semiconductor material layer formed of a semiconductor material doped with an N-type impurity, a P-type semiconductor material layer formed of a semiconductor material doped with a P-type impurity, and an I-type semiconductor material layer located between the N-type semiconductor material layer and the P-type semiconductor material layer and formed of a low-doped intrinsic semiconductor material.

In the embodiments, the detection substrate 100 is applicable in a ray imaging device, so that it is required to provide the photoelectric converter 130. It should be understood that, in other embodiments, the optoelectronic converter 130 may be omitted or replaced by other structures or functional units, depending on functional requirements. In addition, the photoelectric converter 130 may sense visible light converted by a ray conversion layer such as scintillator, or may directly sense ray such as X-ray, and the embodiments of the present disclosure are not limited thereto.

In the detection substrate 100, each of the pixel 140 includes a sensing thin film transistor 120 and a photoelectric converter 130.

Figure 2:
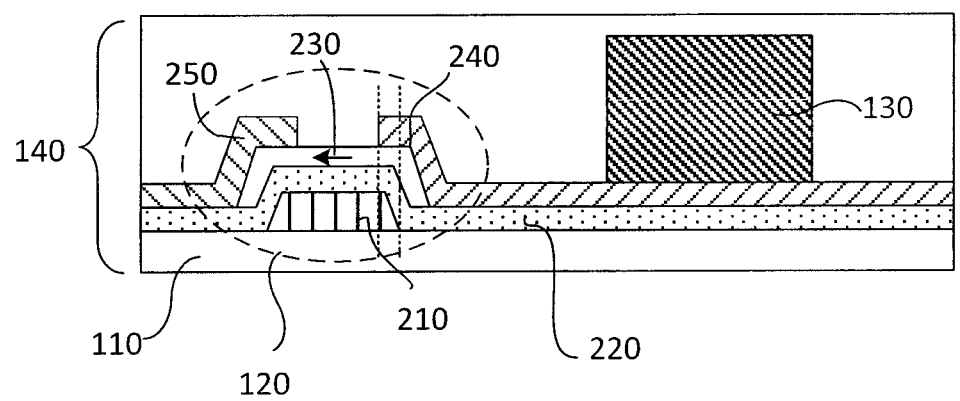
FIG. 2 is a view showing a layered structure of a pixel of the detection substrate shown in FIG. 1.

FIG. 2 is a layered structural view of a pixel 140 of the detection substrate shown in FIG. 1. It should be understood that the structure of FIG. 2 is exemplary and does not limit the scope of the disclosure. In other embodiments of the present disclosure, the pixel 140 and the sensing thin film transistor 120 therein may also have other suitable structures.

As can be seen from FIG. 2, each of the pixels 140 includes the base substrate 110, the sensing thin film transistor 120, and the photoelectric converter 130.

The sensing thin film transistor 120 is disposed on the base substrate 110 and includes the gate electrode 210, a gate insulating layer 220, an active layer 230, the source electrode 240, and the drain electrode 250. The active layer 230 includes a channel region in a middle portion thereof. When the sensing thin film transistor 120 is in on-state, a current is generated between the source electrode and the drain electrode through the channel region.

Generally, in the sensing thin film transistor 120, there are a parasitic capacitance between the gate electrode 210 and the source electrode 240 and a parasitic capacitance between the gate electrode 210 and the drain electrode 250. For example, two vertical dashed lines in FIG. 2 indicate an overlap portion between the gate electrode 210 and the source electrode 240 in the source-drain direction or a direction from the source electrode to the drain electrode (i.e., horizontal direction in FIG. 2). A parasitic capacitance in the overlap portion between the gate electrode 210 and the source electrode 240 may be estimated by, for example, a method of calculating a capacitance of a panel capacitor. It should be understood that, even if there is no overlap portion between the gate electrode 210 and the source electrode 240 or between the gate electrode 210 and the drain electrode 250 in the source-drain direction, there may be still a parasitic capacitance between the gate electrode 210 and the source electrode 240 or between the gate electrode 210 and the drain electrode 250, and the estimation method may be more complex. For a thin film transistor having a "-" shape channel, the parasitic capacitance may be estimated more accurately by the method of calculating the capacitance of the panel capacitor. For a thin film transistor having a channel of other shapes (for example, "U" shape or "L" shape), the method may at least provide a qualitative reference. Hereinafter, for convenience of explanation, the thin film transistor having a "-" shape channel will be taken as an example, and the parasitic capacitance between the gate electrode and the source electrode may be simply expressed by $Cgs = ks \cdot W \cdot Ls$, and the parasitic capacitance between the gate electrode and the drain electrode may be simply expressed by $Cgd = kd \cdot W \cdot Ld$, wherein W is a channel length, Ls is a length of the overlap portion between the gate electrode and the source electrode, Ld is a length of the overlap portion between the gate electrode and the drain electrode, and ks and kd are fitting coefficients, respectively. It should be understood that the scope of the present disclosure is not limited thereto.

In the configuration of FIG. 2, a value of Cgs may affect electrical signal output from the signal read line, thereby affecting uniformity of an image obtained based on the output electrical signal. When the sensing thin film transistors 120 are fabricated, the gate electrode 210, the gate insulating layer 220, the active layer 230, the source electrode 240, and the drain electrode 250 are formed according to specific positional parameters such as a position of a source/drain layer pattern. However, due to process errors and the like, when different sensing thin film transistor columns are fabricated, there is no guarantee that the positional parameters are actually exactly the same among the plurality of sensing thin film transistor columns. Therefore, the lengths of the overlap portions between the gate electrodes and the source electrodes may be different among different sensing thin film transistor columns, thereby causing a difference in Cgs. For example, if a position of the source/drain layer pattern is shifted by S towards the left side in FIG. 2, then the length of the overlap portion between the gate electrode and the source electrode may be increased by S, so that Cgs may be increased by $ks \cdot W \cdot S$.

This difference in Cgs generated during actual fabrication may result in a decrease in accuracy of the image (e.g., an X-ray image in X-ray detection functions) ultimately obtained based on the output electrical signal.

It should also be understood that, for ease of illustration, in embodiments of the present disclosure, uniformities of Cgd and other possible parasitic capacitances, resistances, inductances or the like on the base substrate are not considered.

Here, it should also be noted that the "source-drain direction", that is, the direction from the source electrode to the drain electrode, may be defined with reference to the structure of FIG. 2, and as shown in FIG. 2, a portion of the active layer 230 that is parallel to the base substrate may extend from the source electrode 240 to the drain electrode 250, thus such an extending direction of the portion of the active layer 230 may be defined as the "source-drain direction". In FIG. 2, the source-drain direction is parallel to both the base substrate and the paper surface, and is indicated by an arrow from the source electrode 240 to the drain electrode 250.

Figure 3A:
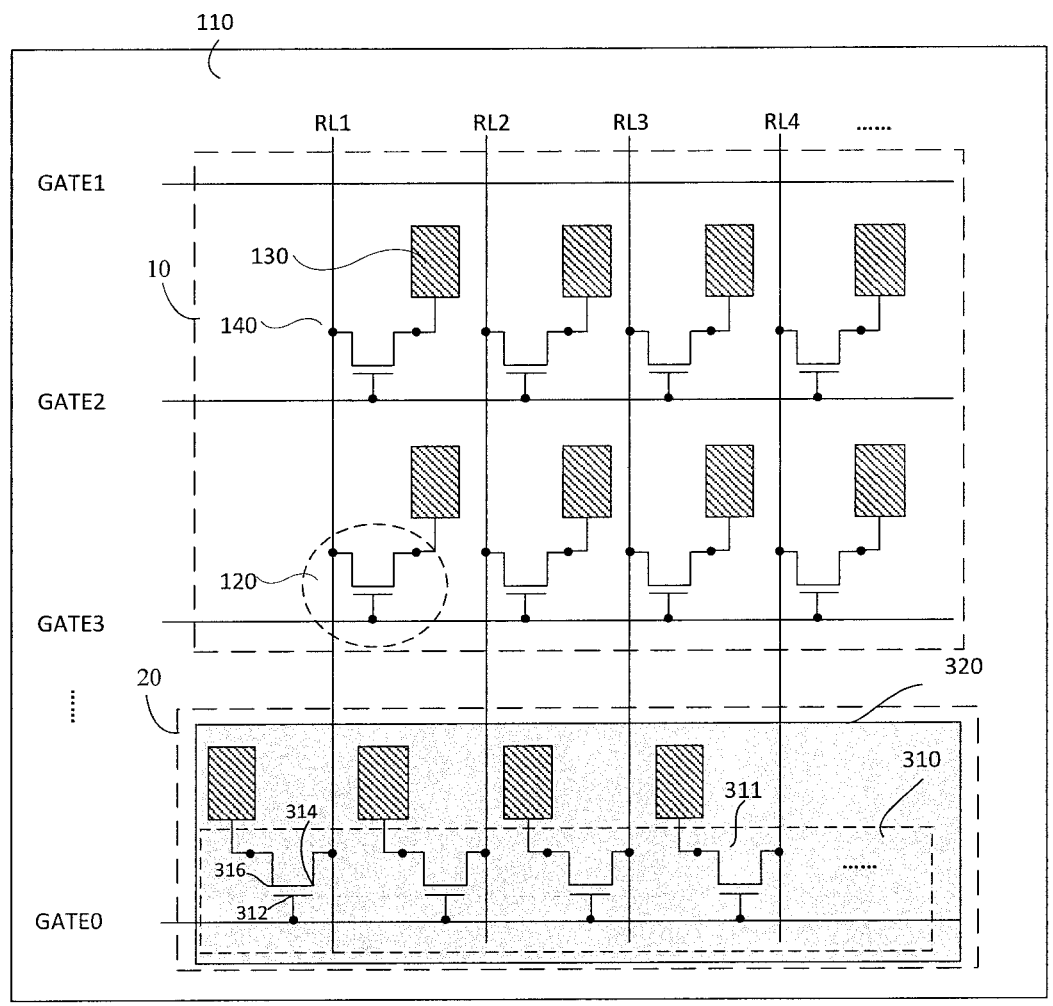
FIG. 3A shows an equivalent circuit diagram of a detection substrate according to some embodiments of the present disclosure.

FIG. 3A shows an equivalent circuit diagram of a detection substrate 300 according to some embodiments of the present disclosure.

Compared with the detection substrate 100, the detection substrate 300 may further include an auxiliary region, that is, the detection substrate 300 may include a sensing region 10 and an auxiliary region 20. The detection substrate 300 may further include a compensation thin film transistor row 310 and a compensation gate line GATE0. As shown in FIG. 3A, the compensation thin film transistor row 310 includes a plurality of compensation thin film transistors 311. Each of the compensation thin film transistors 311 includes a gate electrode 312, a first electrode (e.g., a drain electrode) 314, and a second electrode (e.g., a source electrode) 316. The plurality of compensation thin film transistors 311 are in one-to-one correspondence with the plurality of sensing thin film transistor columns.

In some embodiments, the sensing region corresponds to a central region of a panel to be fabricated, and the auxiliary region corresponds to an edge region of the panel. It should be noted that the auxiliary region may be arranged side by side with the sensing region in a particular direction of the panel (as shown in FIG. 3A), or the auxiliary region may be arranged to partially or completely surround the sensing region.

The compensation thin film transistors 311 in the compensation thin film transistor row 310 are in one-to-one correspondence with the sensing thin film transistor columns. The gate electrode 312 of each of the compensation thin film transistors 311 is electrically connected to the compensation gate line GATE0, and the first electrode 314 (the drain electrode in the embodiment of FIG. 3A) of each of the compensation thin film transistors 311 is electrically connected to the same signal read line as the sensing thin film transistors in the corresponding sensing thin film transistor column, that is, electrically connected to one of the plurality of signal read lines RL1-RLn.

In some embodiments, the compensation thin film transistor row 310 is located in the auxiliary region. Alternatively, the compensation thin film transistor row 310 may be located in the sensing region.

Each of the compensation thin film transistors is connected to the same signal read line RL to one of the sensing thin film transistor columns. For example, as shown in FIG. 3A, first compensation thin film transistor in the compensation thin film transistor row 310 (starting from the left side) is connected to the signal read line RL1, and the sensing thin film transistors in first thin film transistor column (starting from the left side) are also connected to the signal read line RL1. During fabrication, the thin film transistors connected to the same one signal read line RL1 are fabricated in the same fabrication step (i.e., through the same patterning process). For example, the first compensation thin film transistor in the compensation thin film transistor row 310 and the sensing thin film transistors in the first thin film transistor column are formed in the same fabrication step. Thus, if there is a position shift for the source/drain layer pattern of each of the sensing thin film transistors and the compensation thin film transistor electrically connected to the same signal read line, the position shift in the compensation thin film transistor may be consistent with the position shift of each of the sensing thin film transistors, for example, both the position shifts may be leftward or rightward.

As can be seen from FIG. 3A, among the sensing thin film transistors 120 and the compensation thin film transistor 311 which are electrically connected to the same one signal read line RL, the compensation thin film transistor 311 and the sensing thin film transistors 120 are located on different sides of the signal read line RL. Thereby, the source-drain direction (from left to right in FIG. 3A) of each compensation thin film transistor 311 is opposite to the source-drain direction (from right to left in FIG. 3A) of each sensing thin film transistor 120. In some embodiments, among the sensing thin film transistors 120 and the compensation thin film transistor 311 which are electrically connected to the same one signal read line RL, the sensing thin film transistors 120 have the same specifications as the compensation thin film transistor 311, except for the source-drain direction. The specifications may include the TFT type, the channel shape, the critical dimension and the like.

Figure 3B:
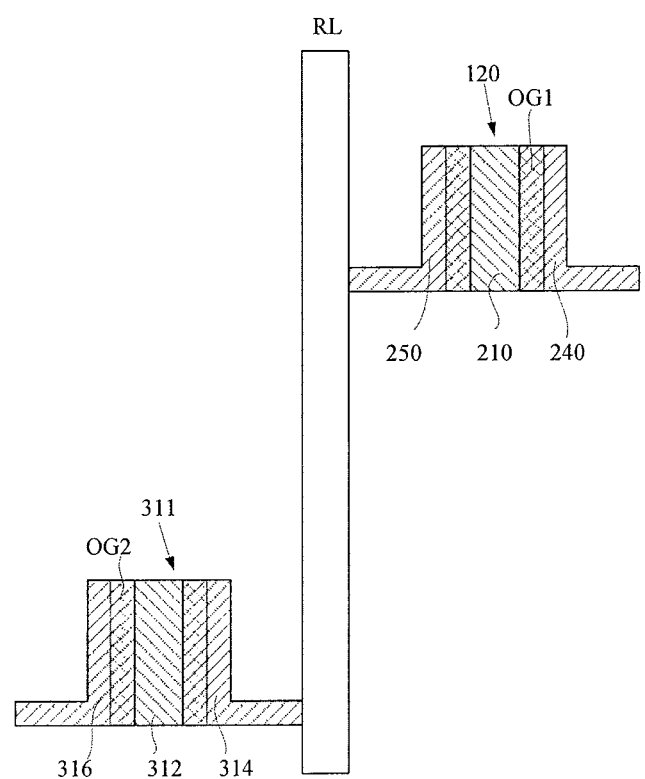
FIG. 3B is a schematic plan view showing there is no position shift for a source/drain layer pattern of thin film transistors on the detection substrate according to some embodiments of the present disclosure.
Figure 3C:
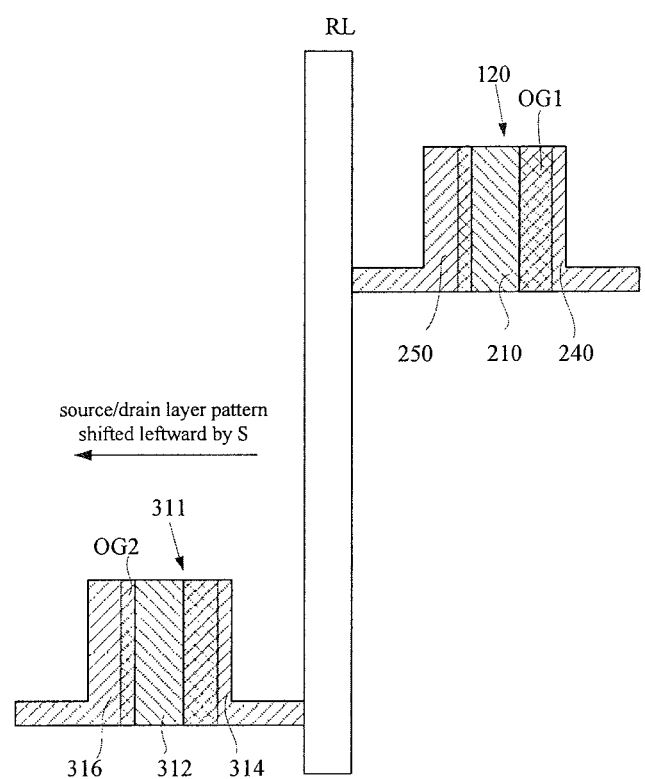
FIG. 3C is a schematic plan view showing there is a leftward position shift for a source/drain layer pattern of thin film transistors on the detection substrate according to some embodiments of the present disclosure.
Figure 3D:
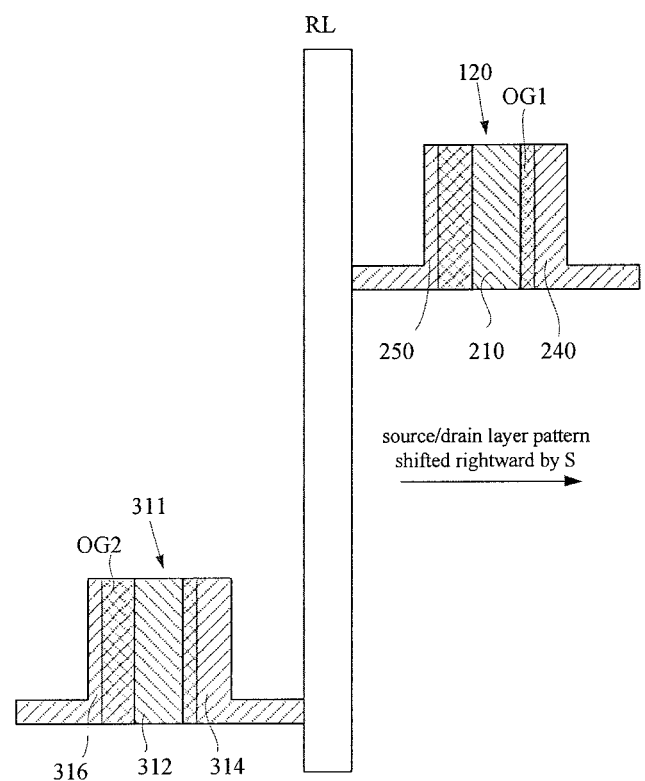
FIG. 3D is a schematic plan view showing there is a rightward position shift for a source/drain layer pattern of thin film transistors on the detection substrate according to some embodiments of the present disclosure.

In some embodiments, as shown in FIG. 3B to FIG. 3D, among the sensing thin film transistors 120 and the compensation thin film transistor 311 which are electrically connected to the same one signal read line RL, an orthographic projection of the gate electrode 210 of the sensing thin film transistor 120 on the base substrate 110 partially overlaps with an orthographic projection of the source electrode 240 of the sensing thin film transistor 120 on the base substrate 110, to form a first overlap region OG1; an orthographic projection of the gate electrode 312 of the compensation thin film transistor 311 on the base substrate 110 partially overlaps with an orthographic projection of the source electrode 316 of the compensation thin film transistor 311 on the base substrate 110, to form a second overlap region OG2. For example, there is theoretically no position shift for the source/drain layer pattern of each of the fabricated sensing thin film transistors and compensation thin film transistors, as shown in FIG. 3B, an area of the first overlap region OG1 may be equal to an area of the second overlap region OG2. However, due to process errors and the like, there is actually a position shift for the source/drain layer pattern of each of the actually fabricated sensing thin film transistors and compensation thin film transistors. As shown in FIG. 3C, a position of the source/drain layer pattern may be shifted leftward by S, or as shown in FIG. 3D, a position of the source/drain layer pattern may be shifted rightward by S, as a result, an area of the first overlap region OG1 is not equal to an area of the second overlap region OG2.

As described above, the source/drain layer pattern of the compensation thin film transistor 311 is shifted in consistent with the source/drain layer pattern of the sensing thin film transistors 120. In this case, the source-drain direction of the compensation thin film transistor 311 is set to be opposite to the source-drain direction of each of the sensing thin film transistors 120, such that a change in Cgs of the compensation thin film transistor is opposite to a change in Cgs of each of the sensing thin film transistors. For example, if there is no position shift, as shown in FIG. 3B, the parasitic capacitance Cgs1 between the gate electrode and the source electrode of each of the sensing thin film transistors 120 may be expressed as Cgs1=Cgs0, similarly, the parasitic capacitance Cgs2 between the gate electrode and the source electrode of the compensation thin film transistor 311 may be expressed as Cgs2=Cgs0. It should be understood that the sensing thin film transistors and the compensation thin film transistor are fabricated on the base substrate according to the same specifications, so that a value of the capacitance between the gate electrode and the source electrode of the sensing thin film transistor is to be equal to a value of the capacitance between the gate electrode and the source electrode of the compensation thin film transistor if there is no position shift. If a position of the source/drain layer pattern is shifted leftward by S as shown in FIG. 3C, a length of the first overlap region OG1 is increased by S, so that Cgs1 is increased by ks·W·S, that is, Cgs1=Cgs0+ks·W·S. In contrast, a length of the second overlap region OG2 is decreased by S, so that Cgs2 is decreased by ks·W·S, that is, Cgs2=Cgs0−ks·W·S. A value of Cgs1 is increased while a value of Cgs2 is decreased, so that a sum of Cgs1 and Cgs2 is independent of the position shift due to Cgs1+Cgs2=2Cgs0. If a position of the source/drain layer pattern is shifted rightward by S as shown in FIG. 3D, the length of the first overlap region OG1 is decreased by S, so that Cgs1 is decreased by ks·W·S, that is, Cgs1=Cgs0−ks·W·S. In contrast, the length of the second overlap region OG2 is increased by S, so that Cgs2 is increased by ks·W·S, that is, Cgs2=Cgs0+ks·W·S. The value of Cgs1 is decreased while the value of Cgs2 is increased, so that a sum of Cgs1 and Cgs2 is also independent of the position shift due to Cgs1+Cgs2=2Cgs0.

An influence of the parasitic capacitance Cgs on the output signal is independent of amount of light detected by the photoelectric converter, and depends on a voltage on the gate electrode of the thin film transistor. In some embodiments, the influence of the parasitic capacitance Cgs on the output signal may be expressed as a term K·Cgs·VGH, in which VGH denotes a high level of the voltage on the gate electrode and K is a fitting coefficient. It should be understood that this is merely an exemplary representation for ease of illustration. In other embodiments, the influence of the parasitic capacitance Cgs on the output signal may be expressed by other representations that are qualitatively consistent with this embodiment. The following embodiments will be described with reference to this embodiment.

By designing an appropriate signal collecting scheme, a change in Cgs in the sensing thin film transistor is opposite to a change in Cgs in the compensation thin film transistor so as to compensate for the output signal, so that the output signal is independent of the position shift of the source/drain layer pattern, thus uniformity of an output image is guaranteed.

As described above, the photoelectric converter 130 is provided in each of the pixels in which the sensing thin film transistors 130 are located. In some embodiments, the photoelectric converter may also be provided in each of the pixels in which the compensation thin film transistors are located. However, since only the Cgs term of the compensation thin film transistor is required to perform the compensation, the photoelectric converters in the pixels in which the compensation thin film transistors are located may be covered by a light shielding layer. That is, an orthographic projection of the light shielding layer on the base substrate covers an orthographic projection of the photoelectric converters in the pixels in which the compensation thin film transistors are located on the base substrate, and the photoelectric converters are located between the light shielding layer and the base substrate.

Generally, all the thin film transistors on a detector panel may be covered by a light shielding layer to prevent light illumination from affecting the thin film transistors. For example, the light illumination may cause leakage currents in the thin film transistors, thereby affecting performance of the entire device. In some embodiments, as shown in FIG. 3A, both the sensing thin film transistors and the compensation thin film transistors may be covered by the same light shielding layer (e.g., light shielding layer 320 in FIG. 3A).

In other embodiments, no photoelectric converters are provided in the pixels in which the compensation thin film transistors are located, and the second electrode of each of the compensation thin film transistors may be floating, which will not affect the compensation function of the compensation thin film transistors. As no photoelectric converters are provided in the pixels in which the compensation thin film transistors are located, the panel may be less occupied. In this way, an optimized panel design may be realized.

In some embodiments, the light shielding layer is made of metal.

Figure 4:
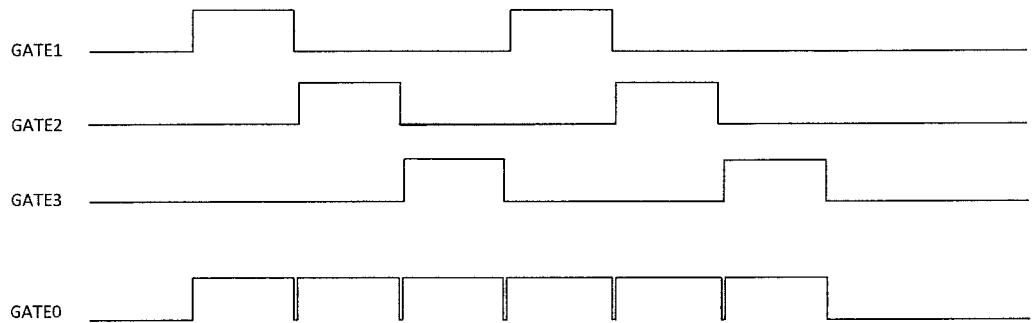
FIG. 4 shows a timing diagram of gate lines according to some embodiments of the present disclosure.

Further, the compensation gate line may be driven and controlled to turn on the compensation thin film transistors in the compensation thin film transistor row 310 while one of the plurality of gate lines GATE is scanned to turn on the corresponding sensing thin film transistors. For example, FIG. 4 illustrates a timing diagram of gate lines according to some embodiments of the present disclosure. For the sake of simplicity, FIG. 4 illustrates only the case where m is equal to 3, that is, the pixel array includes only three rows, and only three gate lines GATE1, GATE2, and GATE3. As can be seen from FIG. 4, the three gate lines GATE1, GATE2, and GATE3 sequentially supply a high level VGH, and the compensation gate line GATE0 supplies a high level while any one of the three gate lines supplies the high level, so that the compensation thin film transistors in the compensation thin film transistor row 310 are turned on while each row of the sensing thin film transistors are turned on. It should be noted that there is a time interval between periods when GATE1, GATE2, and GATE3 supply the high level in FIG. 4 (may also refer to a graph of GATE0), for example, collected electrical signal may be processed during these time intervals, which is particularly applicable to a case where a large collecting speed is not required. However, in other embodiments, there may be no time interval or larger time interval between periods when GATE1, GATE2, and GATE3 supply the high level, and the embodiments of the present disclosure are not limited thereto. For example, there may be no time interval between periods when GATE1, GATE2, and GATE3 supply the high level, that is, GATE0 may be supplied with the high level continuously, which is particularly applicable to a case where a large collecting speed is required.

In such a configuration, the item K·Cgs2·VGH caused by the compensation thin film transistor is added into the electrical signal of each pixel output from the signal read line electrically connected to the compensation thin film transistor, so that the term related to Cgs in the electrical signal is changed from K·Cgs1·VGH to K·(Cgs1+Cgs2)·VGH. In this case, even if the position of the source/drain layer pattern is shifted by S to one side (for example, the left side) in FIG. 3A or FIG. 3B so that Cgs1 will be increase by ks·W·S while Cgs2 will be decreased by ks·W·S, the sum of Cgs1 and Cgs2 remains unchanged due to Cgs1+Cgs2=2Cgs0, thus the output electrical signal is independent of the position shift S due to K·(Cgs1+Cgs2)·VGH=2K·Cgs0·VGH.

In some embodiments, it is also necessary to consider an influence of "dark current" on the signal output from the signal read line RL. In actual detection, even if all the photoelectric converters are shielded from light, that is, no photo-sensing phenomenon occurs, electrical signal at a certain level, that is, output signal generated by "dark current", is output from the signal read line RL. In order to make actually collected signal more accurate, it is necessary to subtract a term related to "dark current" from the output signal.

Figure 5:
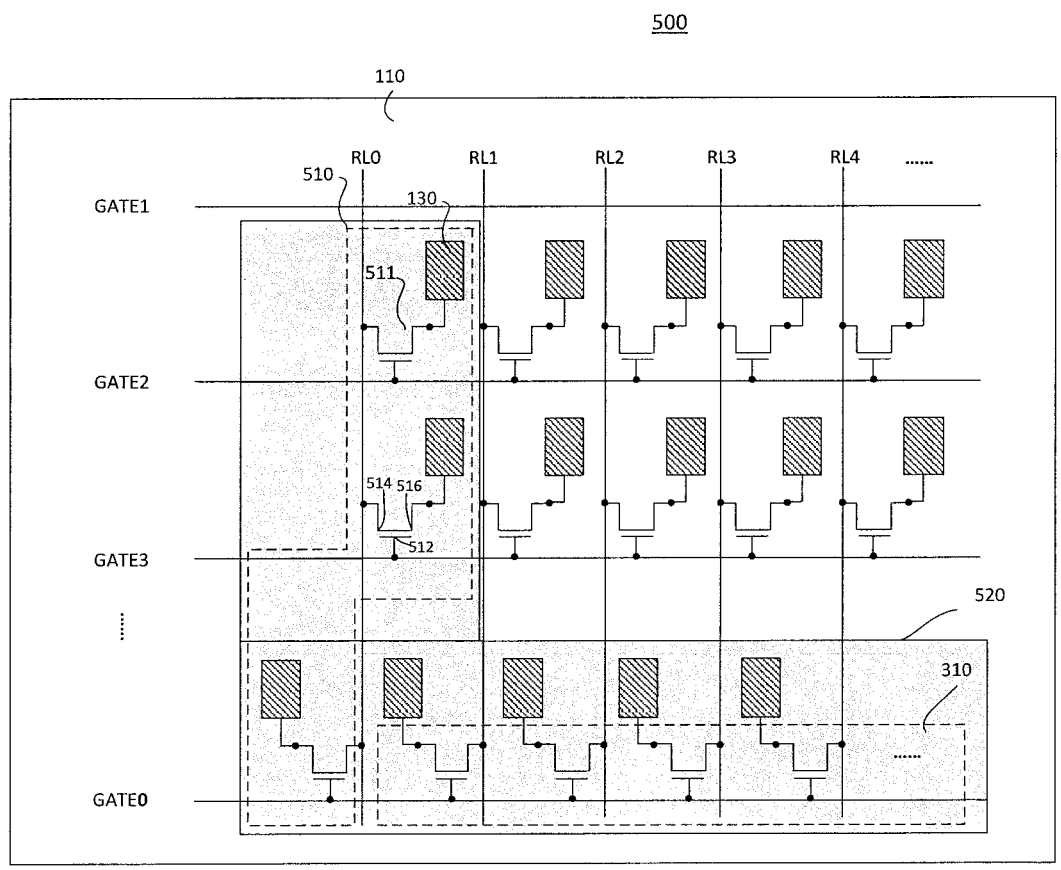
FIG. 5 shows an equivalent circuit diagram of a detection substrate according to some embodiments of the present disclosure.

FIG. 5 shows an equivalent circuit diagram of a detection substrate 500 according to some embodiments of the present disclosure.

Compared with the detection substrate 300 in FIG. 3A, the detection substrate 500 further includes a dummy thin film transistor column 510 and a dummy signal read line RL0. The dummy thin film transistor column 510 is also disposed in the auxiliary region. The dummy thin film transistor column 510 includes a plurality of dummy thin film transistors 511. Each of the dummy thin film transistors 511 includes a gate electrode 512, a first electrode (e.g., drain electrode) 514, and a second electrode (e.g., source electrode) 516. The first electrode (drain electrode in FIG. 5) 514 of each of the dummy thin film transistors 511 is electrically connected to the dummy signal read line RL0, and the gate electrode 512 of each of the dummy thin film transistors 511 is respectively electrically connected to one of the plurality of gate lines GATE1-GATEm or the compensation gate line GATE0.

In FIG. 5, the second electrodes (source electrodes in FIG. 5) 516 of the dummy thin film transistors are respectively connected to photoelectric converters 130 which may be covered by a light shielding layer (for example, the same light shielding layer as the light shielding layer covering the thin film transistors, such as the light shielding layer 520 as shown in FIG. 5). That is, an orthographic projection of the light shielding layer 520 on the base substrate covers an orthographic projection of the photoelectric converters 130 in the pixels, in which the dummy thin film transistors are located, on the base substrate, so that signal output from RL0 does not include any electrical signal generated by the photoelectric converter.

In some embodiments, only the dark current term and the Cgs term are considered for the signal output from RL0. Thus, during one subframe (corresponding to a period when one of GATE1-GATEm supplies a high level), the signal output from RL0 includes the dark current term and the Cgs term, the signal output from any one (such as RLx, 1≤x≤n) of RL1-RLn includes a photoelectric conversion term, the dark current term, and the Cgs term. Thus, by subtracting the signal output from RL0 from the signal output from RLx, the photoelectric conversion term in the signal output from RLx is obtained, that is, a signal portion corresponding to actually collected X-ray is obtained.

It should be noted that, in the above embodiments, it is assumed that the sensing thin film transistors, the compensation thin film transistors, and the dummy thin film transistors are fabricated on the base substrate according to the same specifications, and thus it is considered that the influences caused by the dark currents generated in various thin film transistors are consistent with one another. Thus, the dark current term may be compensated by subtracting the signal output from RL0 from the signal output from RLx. Regarding the Cgs term, the above-described compensation process with reference to FIGS. 3A-4 may be performed before subtracting the signal output from RL0 from the signal output from RLx, so that both the Cgs term in the signal output from RLx and the Cgs term in the signal output from RL0 are independent of position shifts of the source/drain layer patterns, respectively, for example, they may both be expressed by 2K·Cgs0·VGH. Thus, by subtracting the signal output from RL0 from the signal output from RLx, the Cgs term may be completely compensated.

Figure 6:
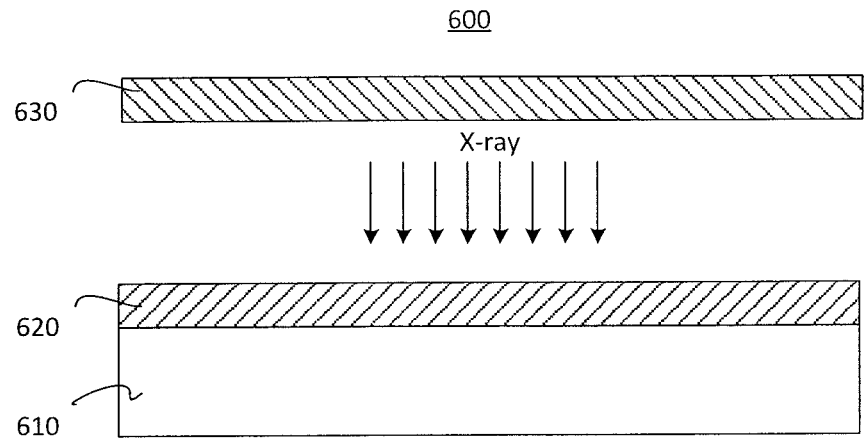
FIG. 6 shows a schematic view of a ray imaging device according to some embodiments of the present disclosure.

FIG. 6 shows a schematic view of a ray imaging device 600 according to some embodiments of the present disclosure.

As shown in FIG. 6, the ray imaging device 600 may include a detection substrate 610 and a ray generator 630. The detection substrate 610 may be a detection substrate, such as the detection substrate 300 or 500, according to the above embodiments. Thus, the above descriptions in connection with FIG. 3A or FIG. 5 are equally used herein.

For example, the ray generator 630 may be an X-ray generator. As shown in FIG. 6, the ray generator 630 is located at a side of the detection substrate 610 to emit rays which may be supplied to the detection substrate.

Optionally, the ray imaging device 600 may further include ray conversion layer 620. For example, the ray conversion layer 620 may be an X-ray conversion layer. The ray conversion layer 620 may be disposed on a side of the photoelectric converters facing away from the base substrate.

For example, the X-ray conversion layer may be a scintillator. The scintillator may have configurations such as scintillation fiber, scintillation panel, scintillator coupling wavelength-shifting fiber and the like, and material of the scintillator may be selected from CsI, BGO, LSO, GSO or the like.

The X-ray conversion layer may be configured to convert X-ray into visible light and enable the visible light to irradiate onto the detection substrate 610. Then, the photoelectric converters on the detection substrate 610 convert the visible light into electrical signal and store the electrical signal. When one of the thin film transistors electrically connected to the photoelectric converters is turned on, the electrical signal is output through the signal read line, and is further processed so as to obtain image information.

Figure 7:
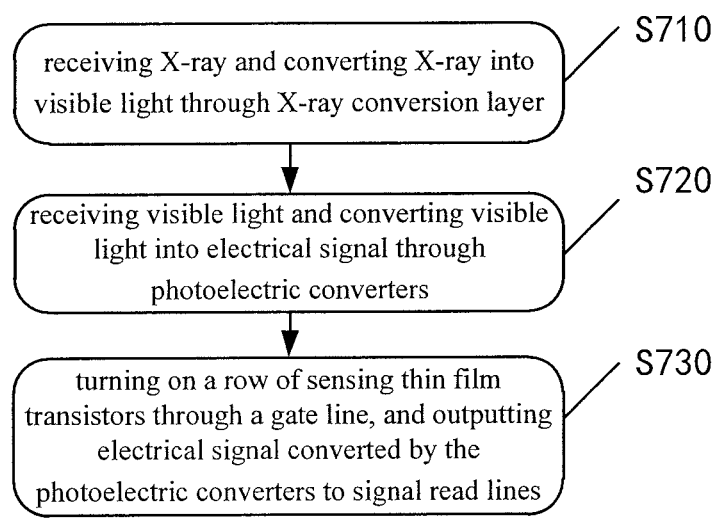
FIG. 7 shows a flow chart of a method of detecting X-ray using X-ray panel detector according to some embodiments of the present disclosure.

FIG. 7 shows a flow chart of a method 700 of detecting X-ray using a ray imaging device according to some embodiments of the present disclosure. The Ray imaging device may be, for example, a ray imaging device 600, such that the above descriptions in conjunction with FIG. 6 (and in conjunction with FIG. 3A or FIG. 5) are equally applicable herein and will not be described again.

In step S710, the X-ray conversion layer (e.g., X-ray conversion layer 620) receives X-ray and converts the received X-ray into visible light.

In step S720, the photoelectric converters receive the visible light and convert the visible light into electrical signal.

In step S730, one gate line is scanned to turn on a row of sensing thin film transistors, and the electrical signal converted by the corresponding photoelectric converters is output to the signal read line through the row of sensing thin film transistors.

In the step S730, the compensation gate line is also scanned to turn on the compensation thin film transistors in the compensation thin film transistor row, so that electrical signal generated by the compensation thin film transistors is output to the signal read lines. As a result, the electrical signal which is output to the signal read line from the sensing thin film transistor and the electrical signal which is output to the same signal read line from the compensation thin film transistor are added together to output a compensation electrical signal. Thereby, the influence of the position shift of the source/drain layer pattern on the output electrical signal is compensated by means of the step S730.

Correspondingly, the embodiments of the present disclosure may provide a method for driving the detection substrate. The method may include the following steps: turning on a row of the sensing thin film transistors through the gate line; turning on the compensation thin film transistors in the compensation thin film transistor row through the compensation gate line while the row of the sensing thin film transistors are turned on; and adding electrical signal which is output to the signal read line from the sensing thin film transistor and electrical signal which is output to the same signal read line from the compensation thin film transistor together to output a compensation electrical signal.

In some embodiments, the method further includes: subtracting the electrical signal output from the dummy signal read line from the compensation electrical signal output from any one of the signal read lines so as to revise the compensation electrical signal. Thus, by means of this step, the influences of both the dark current and the parasitic capacitance between the gate electrode and the source electrode are removed from the output electrical signal, thereby obtaining more accurate electric signal corresponding to actually collected X-ray.

The present disclosure has been described with reference to some exemplary embodiments, and it should be understood that the terms used herein are illustrative and exemplary, rather than restrictive. The present disclosure may be embodied in a variety of forms without departing from the spirit or scope of the present disclosure. It is to be understood that the above-described embodiments are not limited to the above-described details, but are construed broadly within the spirit and scope defined by appended claims. Thus, all changes and modifications that fall within the scope of the claims or equivalents thereof are intended to be covered by the appended claims.

What is claimed is:

1. A detection substrate comprising:
    a base substrate comprising a sensing region and an auxiliary region;
    a plurality of sensing thin film transistors arranged in a matrix in the sensing region to form a plurality of sensing thin film transistor rows and a plurality of sensing thin film transistor columns;
    a plurality of signal read lines and a plurality of gate lines in the sensing region, wherein the plurality of signal read lines cross the plurality of gate lines, respectively, first electrodes of the sensing thin film transistors in each of the sensing thin film transistor columns are electrically connected to the same signal read line, and gate electrodes of the sensing thin film transistors in each of the sensing thin film transistor rows are electrically connected to the same gate line;

a compensation thin film transistor row in the auxiliary region, the compensation thin film transistor row comprising a plurality of compensation thin film transistors, wherein the plurality of compensation thin film transistors are in one-to-one correspondence with the plurality of sensing thin film transistor columns, and a first electrode of each of the compensation thin film transistors is electrically connected to the same signal read line as the first electrodes of the sensing thin film transistors in the corresponding sensing thin film transistor column; and a compensation gate line electrically connected to a gate electrode of each of the compensation thin film transistors, wherein, as for the sensing thin film transistors and the compensation thin film transistor electrically connected to the same signal read line, both the first electrodes of the sensing thin film transistors and the first electrode of the compensation thin film transistor are source electrodes or both the first electrodes of the sensing thin film transistors and the first electrode of the compensation thin film transistor are drain electrodes, source-drain directions of the sensing thin film transistors are consistent with one another, and a source-drain direction of the compensation thin film transistor is opposite to each of the source-drain directions of the sensing thin film transistors, wherein, as for the sensing thin film transistors and the compensation think film transistor electrically connected to the same signal read line, the sensing thin film transistors are located at a first side of the signal read line, and the compensation think film transistor is located at a second side, different from the first side, of the signal read line.

2. The detection substrate according to claim 1, further comprising:

a dummy thin film transistor column in the auxiliary region, the dummy thin film transistor column comprising a plurality of dummy thin film transistors, wherein the plurality of dummy thin film transistors are in one-to-one correspondence with the plurality of sensing thin film transistor rows or the compensation thin film transistor row, and a gate electrode of each of the dummy thin film transistors is electrically connected to the same gate line as the gate electrodes of the sensing thin film transistors in the corresponding sensing thin film transistor row or electrically connected to the same compensation gate line as the gate electrodes of the compensation thin film transistors in the corresponding compensation thin film transistor row; and a dummy signal read line, a first electrode of each of the dummy thin film transistors electrically connected to the dummy signal read line, wherein source-drain directions of the dummy thin film transistors corresponding to the sensing thin film transistor rows are consistent with one another, and a source-drain direction of the dummy thin film transistor corresponding to the compensation thin film transistor row is opposite to each of the source-drain directions of the dummy thin film transistors corresponding to the sensing thin film transistor rows.

3. The detection substrate according to claim 2, wherein the dummy thin film transistors corresponding to the sensing thin film transistor rows are located at a first side of the dummy signal read line, and the dummy thin film transistor corresponding to the compensation thin film transistor row is located at a second side, different from the first side, of the dummy signal read line.

4. The detection substrate according to claim 2, wherein the source-drain direction of each of the sensing thin film transistors, the compensation thin film transistors and the dummy thin film transistors is perpendicular to an extending direction of the signal read line electrically connected to the each of the sensing thin film transistors, the compensation thin film transistors and the dummy thin film transistors.

5. The detection substrate according to claim 2, further comprising a plurality of photoelectric converters on the base substrate, the plurality of photoelectric converters electrically connected to second electrodes of the sensing thin film transistors and second electrodes of the dummy thin film transistors, respectively, wherein the photoelectric converters electrically connected to the second electrodes of the dummy thin film transistors are covered by a light shielding layer and located between the light shielding layer and the base substrate.

6. The detection substrate according to claim 5, wherein the plurality of photoelectric converters further comprise photoelectric converters respectively electrically connected to second electrodes of the compensation thin film transistors, and wherein the photoelectric converters electrically connected to the second electrodes of the compensation thin film transistors are covered by the light shielding layer and located between the light shielding layer and the base substrate.

7. The detection substrate according to claim 6, wherein, as for the sensing thin film transistors and the compensation thin film transistor electrically connected to the same signal read line, an orthographic projection of the gate electrode of each sensing thin film transistor on the base substrate partially overlaps an orthographic projection of the second electrode of the each sensing thin film transistor on the base substrate to form a first parasitic capacitance; and an orthographic projection of the gate electrode of the compensation thin film transistor on the base substrate partially overlaps an orthographic projection of the second electrode of the compensation thin film transistor on the base substrate to form a second parasitic capacitance, and wherein a value of the first parasitic capacitance is not equal to a value of the second parasitic capacitance.

8. The detection substrate according to claim 6, wherein, as for the sensing thin film transistors and the compensation thin film transistor electrically connected to the same signal read line, an orthographic projection of the gate electrode of each sensing thin film transistor on the base substrate partially overlaps an orthographic projection of the second electrode of the each sensing thin film transistor on the base substrate to form a first overlap region; and an orthographic projection of the gate electrode of the compensation thin film transistor on the base substrate partially overlaps an orthographic projection of the second electrode of the compensation thin film transistor on the base substrate to form a second overlap region, wherein an area of the first overlap region is not equal to an area of the second overlap region.

9. The detection substrate according to claim 6, wherein the light shielding layer further covers the sensing thin film transistors, the compensation thin film transistors and the dummy thin film transistors.

10. The detection substrate according to claim 5, wherein second electrodes of the compensation thin film transistors are floating.

11. The detection substrate according to claim 1, wherein, as for the sensing thin film transistors and the compensation thin film transistor electrically connected to the same signal read line, each of the sensing thin film transistors produces a first parasitic capacitance, and the compensation thin film transistor produces a second parasitic capacitance, and a sum of a value of the first parasitic capacitance and a value of the second parasitic capacitance is independent of a position shift of a source/drain layer pattern of each of the sensing thin film transistors and the compensation thin film transistor.

12. The detection substrate according to claim 1, further comprising a plurality of photoelectric converters on the base substrate, the plurality of photoelectric converters electrically connected to second electrodes of the sensing thin film transistors, respectively,
wherein each of the photoelectric converters is configured to receive optical signal and convert the optical signal into electrical signal.

13. The detection substrate according to claim 1, wherein, as for the sensing thin film transistors and the compensation thin film transistor electrically connected to the same signal read line, each of the sensing thin film transistors has the same specifications, except for the source-drain direction, as the compensation thin film transistor.

14. The detection substrate according to claim 1, wherein the compensation gate line is configured to turn on the compensation thin film transistors while any one of the plurality of gate lines is scanned to turn on one of the plurality of sensing thin film transistor rows.

15. The detection substrate according to claim 1, wherein a channel region of each of the sensing thin film transistors and a channel region of each of the compensation thin film transistors have the same shape selected from "-" shape, "U" shape or "L" shape.

16. A ray imaging device comprising:
the detection substrate according to claim 1; and
a ray generator at a side of the detection substrate.

17. A method for driving the detection substrate according to claim 1, comprising:
turning on a row of the sensing thin film transistors through the gate line;
turning on the compensation thin film transistors in the compensation thin film transistor row through the compensation gate line while the row of the sensing thin film transistors are turned on; and
adding electrical signal which is output to the signal read line from the sensing thin film transistor and electrical signal which is output to the same signal read line from the compensation thin film transistor together to output a compensation electrical signal.

18. The method according to claim 17, the detection substrate comprising:
a dummy thin film transistor column in the auxiliary region, the dummy thin film transistor column comprising a plurality of dummy thin film transistors, wherein the plurality of dummy thin film transistors are in one-to-one correspondence with the plurality of sensing thin film transistor rows or the compensation thin film transistor row, and a gate electrode of each of the dummy thin film transistors is electrically connected to the same gate line as the gate electrodes of the sensing thin film transistors in the corresponding sensing thin film transistor row or electrically connected to the same compensation gate line as the gate electrodes of the compensation thin film transistors in the corresponding compensation thin film transistor row; and
a dummy signal read line, a first electrode of each of the dummy thin film transistors electrically connected to the dummy signal read line,
wherein source-drain directions of the dummy thin film transistors corresponding to the sensing thin film transistor rows are consistent with one another, and a source-drain direction of the dummy thin film transistor corresponding to the compensation thin film transistor row is opposite to each of the source-drain directions of the dummy thin film transistors corresponding to the sensing thin film transistor rows;
the method further comprising: subtracting electrical signal output from the dummy signal read line from the compensation electrical signal output from any one of the signal read lines so as to revise the compensation electrical signal.

* * * * *